(12) United States Patent
Ohtsuki et al.

(10) Patent No.: US 7,136,318 B2
(45) Date of Patent: Nov. 14, 2006

(54) SEMICONDUCTOR MEMORY DEVICE AND CIRCUIT LAYOUT OF DUMMY CELL

(75) Inventors: Hirohisa Ohtsuki, Ashiya (JP); Kazuo Itoh, Takatsuki (JP); Katsuji Satomi, Osaka (JP); Hironori Akamatsu, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/156,706

(22) Filed: Jun. 21, 2005

(65) Prior Publication Data

US 2005/0286323 A1   Dec. 29, 2005

(30) Foreign Application Priority Data

Jun. 23, 2004   (JP)   ............................. 2004-185163

(51) Int. Cl.
*G11C 7/02* (2006.01)
(52) U.S. Cl. ...................... 365/210; 365/190; 365/156
(58) Field of Classification Search ................ 365/154, 365/156, 210, 190–191
See application file for complete search history.

(56) References Cited

U.S. PATENT DOCUMENTS

| | | | | |
|---|---|---|---|---|
| 5,838,612 | A  * | 11/1998 | Calligaro et al. | ...... 365/185.03 |
| 6,549,484 | B1 * | 4/2003 | Morita et al. | ................ 365/233 |
| 6,646,938 | B1 | 11/2003 | Kodama | |
| 6,760,269 | B1 | 7/2004 | Nakase et al. | |
| 6,982,914 | B1 * | 1/2006 | Ohtsuki et al. | .............. 365/210 |
| 6,999,367 | B1 * | 2/2006 | Yamagami | .................. 365/210 |

FOREIGN PATENT DOCUMENTS

JP   9259589   10/1997
JP   2003036678   2/2003

* cited by examiner

*Primary Examiner*—Gene N. Auduong
(74) *Attorney, Agent, or Firm*—Stevens, Davis, Miller & Mosher, LLP

(57) ABSTRACT

A dummy cell includes two series-connected OFF-state transistors, one end of the series circuit which is formed by these two transistors is connected with a constant voltage source, and the other end of the series circuit is connected with a replica bit line. This suppresses a leak current flowing from the replica bit line to the dummy cell and therefore gives optimal start-up timing to a sense amplifier circuit.

20 Claims, 14 Drawing Sheets

US 7,136,318 B2

SEMICONDUCTOR MEMORY DEVICE AND CIRCUIT LAYOUT OF DUMMY CELL

BACKGROUND OF THE INVENTION

1. Field of the Invention

The present invention relates to a semiconductor memory device which generates, by means of a replica circuit comprising a replica cell whose structure is identical to that of a memory cell which is contained in a memory array, a start-up timing signal for a sense amplifier circuit, and relates to the circuit layout of a dummy cell.

2. Background Art

There are a number of methods for a conventional semiconductor memory device to generate a timing signal for a sense amplifier which amplifies data read from a memory cell and ensures that the timing of reading from a memory cell follows changes attributable to a process, a voltage, etc. Among these is a method of generating a timing signal using a replica circuit (See Patent Literature 1 and Patent Literature 2 for instance.) This method will now be described.

FIG. 1 is a functional block diagram which shows one example of the structure of a semiconductor memory device which uses a replica circuit. In FIG. 1, the semiconductor memory device comprises a memory control circuit 100, SRAM memory cells 101, a memory array 102 formed by the plural SRAM memory cells, a sense amplifier circuit 103 which amplifies and outputs signals transmitted on bit lines BL and NBL which are connected with the memory cells 101, a row decoder 104 which is connected with the memory array 102, replica cells 105, a replica circuit 106 comprising the replica cells 105, a replica word line 107 which sends a signal to the replica circuit 106, a replica bit line 108 which is connected with the replica cells 105, dummy cells 109 which are connected with the replica bit line 108, and a sense amplifier control circuit 110 which is connected with the replica bit line 108 and sends a sense amplifier control signal SAE to the sense amplifier circuit 103.

As shown in FIG. 1, the memory cells 101 are connected in the row direction respectively with word lines WL0 through WLx which are output signal lines from the row decoder 104, and connected in the column direction with common bit lines BL and NBL.

FIG. 2 is a circuitry diagram of the internal structure of the memory cell 101 which is shown in FIG. 1. In FIG. 2, the memory cell 101 is formed by an N-type transistor NA1 whose gate is connected with the word line WLx and whose source is connected with the bit line BL, an N-type transistor NA2 whose gate is connected with the word line WLx and whose source is connected with the bit line NBL, a P-type transistor PL1 whose source receives a power source voltage VDD and whose drain is connected with the drain of the N-type transistor NA1, an N-type transistor ND1 whose gate is connected with the gate of the P-type transistor PL1, whose drain is connected with the drain of the P-type transistor PL1 and whose source is connected with a ground potential VSS, a P-type transistor PL2 whose gate is connected with the drain of the N-type transistor NA1, whose source receives the power source voltage VDD and whose drain is connected with the drain of the N-type transistor NA2 and the gate of the P-type transistor PL1, and an N-type transistor ND2 whose gate is connected with the gate of the P-type transistor PL2, whose drain is connected with the drain of the P-type transistor PL2 and whose source is connected with the ground potential VSS.

The P-type transistor PL1 and the N-type transistor ND1 form a first inverter, the P-type transistor PL2 and the N-type transistor ND2 form a second inverter, and an input terminal and an output terminal of the first inverter are connected respectively with an output terminal and an input terminal of the second inverter, thereby forming a latch circuit.

FIG. 3 is a circuitry diagram which shows the internal structure of the replica cell 105 which is shown in FIG. 1. In FIG. 3, transistors forming the replica cell 105 have the same sizes as the transistors forming the memory cell 101 which is shown in FIG. 2. In the latch circuit included in the replica cell 105, the drain and the source of the P-type transistor PL2 are short-circuited, and the output level of the second inverter formed by the P-type transistor PL2 and the N-type transistor ND2 is fixed at the High level. Meanwhile, the gate of the N-type transistor NA1 is connected with the replica word line REPWL 107.

FIG. 4 is a circuitry diagram of the internal structure of the dummy cell 109A which is shown in FIG. 1. In FIG. 4, transistors forming the dummy cell 109A have the same sizes as the transistors forming the memory cell 11 which is shown in FIG. 2. In addition, the gate of the N-type transistor NA1 is fixed at the Low level.

An operation of the conventional semiconductor memory device having the structure above will now be described. First, one of the word lines WL0 through WLx which are output signal lines from the row decoder 104 is selected, data in the memory cell 101 are read to the bit lines BL and NBL. The bit lines BL and NBL and the replica bit line REPBL 108 are pre-charged to the High level and become floating upon selection from among the word lines WL0 through WLx. The multiple bit lines BL and the multiple bit lines NBL are provided, and plural pieces of data are read to the associated bit lines BL and NBL.

At about the same timing as the timing of selecting from among the word lines WL0 through WLx, the replica word line REPWL 107 which is an output signal line from the control circuit 100 is driven. This makes the transistors of the n replica cells 105 transit the signal level on the replica bit line REPBL 108 from the High level to the Low level at a speed which is n times as fast as that of the memory cells 101. The sense amplifier control circuit 110 then detects the signal level on the replica bit line REPBL 108 and generates the sense amplifier control signal SAE. As the sense amplifier circuit 103 receives the sense amplifier control signal SAE, and therefore amplifies the data on the bit lines BL and NBL.

Where the power source voltage VDD is 1.2 V for example, if one wishes to start up the sense amplifier circuit 103 while reading of data from each memory cell 101 to the associated bit lines BL and NBL accompanies a potential difference of 100 mV, one may decide that the number n of the replica cells 105 to choose is 6, thereby ensuring that the signal level on the replica bit line REPBL 108 would have transmitted 600 mV, that is, down to half the power source voltage VDD at any desired timing that the sense amplifier is supposed to start up, and thereby achieving a benefit that it is possible to generate the sense amplifier control signal SAE at simple CMOS gates without using a complicated potential detection circuit.

Patent Literature 1: Japanese Patent Application Laid-Open Gazette No. H9-259589 (page 4, FIG. 7)

Patent Literature 2: Japanese Patent Application Laid-Open Gazette No. 2003-36678 (pages 5–6, FIGS. 5–6)

However, in the structure above of this semiconductor memory device, internal nodes of the dummy cell 109 are not fixed. The potential at the drain of the N-type transistor NA1 shown in FIG. 4 could therefore change to the Low level. When this occurs, due to a leak current, the N-type transistor NA1 makes the replica bit line REPBL 108 more quickly transit from the High level to the Low level. This shortens the time given to the sense amplifier control circuit 110 to detect the transition of the replica bit line REPBL 108, making it impossible to obtain the desired timing. In some situations, the sense amplifier control signal SAE could come too early and cause the sense amplifier circuit 103 to malfunction.

Meanwhile, in the semiconductor memory device according to Patent Literature 2, the statuses of the dummy cells are fixed such that of paired nodes of the dummy cells, the ones closer to the replica bit line which is driven to the Low level will remain at the High level, for the purpose of preventing a leak current from the dummy cells from quickening the timing at which the replica bit line is driven to the Low level.

However, upon leakage at the access transistors between the dummy cells which are fixed to the High level and the replica bit line which is driven to the Low level, namely, the N-type transistors NA1 shown in FIG. 4, the structure above could block the replica bit line from switching to the Low level, thereby giving rise to an unnecessary current or resulting in failure to achieve the desired timing.

SUMMARY OF THE INVENTION

The present invention has been made in light of these problems, and accordingly aims at providing a semiconductor memory device which suppresses a leak current flowing from a replica bit line to dummy cells and therefore delivers optimal start-up timing to a sense amplifier circuit and providing the circuit layout of the dummy cells.

To achieve this object, the semiconductor memory device according to the present invention comprises: a memory array including plural memory cells; a sense amplifier circuit which amplifies data read from one memory cell of the memory array to a bit line; a replica circuit which includes plural stages of replica cells having the same elements as the plural memory cells and connected with a common replica bit line, and which outputs to the common replica bit line a signal which is at a level which corresponds to the number of the plural stages of replica cells; a dummy cell which is connected as a load with the common replica bit line; and a sense amplifier control circuit which receives the signal on the replica bit line and controls the timing of a signal which starts up the sense amplifier circuit, wherein the dummy cell includes a series circuit which is formed by at least two OFF-state transistors, one end of the series circuit which is formed by the at least two OFF-state transistors is connected with a constant voltage source, and the other end of the series circuit is connected with the common replica bit line.

It is preferable that in the structure above the series circuit which is formed by the at least two OFF-state transistors is a series circuit of transistors of a first conductive type.

The series circuit which is formed by the at least two OFF-state transistors may have a structure formed by a series circuit of a transistor of a first conductive type and a transistor of a second conductive type.

In the structure above, the dummy cell comprises a first, a second, a third and a fourth transistors of a first conductive type, a first and a second transistors of a second conductive type, and a first and a second nodes, the drain, the gate and the source of the first transistor of the first conductive type are connected respectively with a replica bit line, a first constant voltage source and the drain of the second transistor of the first conductive type, the drain, the gate and the source of the second transistor of the first conductive type are connected respectively with the source of the first transistor of the first conductive type, the second node and the first constant voltage source or a second constant voltage source, the drain, the gate and the source of the third transistor of the first conductive type are connected respectively with a replica bit bar line, a word line and the second node, the drain, the gate and the source of the fourth transistor of the first conductive type are connected respectively with the second node, the first node and the first constant voltage source, the drain, the gate and the source of the first transistor of the second conductive type are connected respectively with the first node, the second node and the second constant voltage source, the drain, the gate and the source of the second transistor of the second conductive type are connected respectively with the second node, the first node and the second constant voltage source, and the second node is connected with the first constant voltage source.

The circuit layout according to the present invention is the circuit layout of the dummy cell in the semiconductor memory device above. Within the dummy cell, the first and the second transistors of the first conductive type are arranged side by side vertically such that they share a diffusion layer area, the third and the fourth transistors of the first conductive type are arranged, at positions of point symmetry with respect to the first and the second transistors of the first conductive type, side by side vertically such that they share a diffusion layer area, the first transistor of the second conductive type shares a first straight gate wire with the second transistor of the first conductive type, and is located between the second transistor of the first conductive type and the third transistor of the first conductive type yet closer to the second transistor of the first conductive type, the second transistor of the second conductive type shares a second straight gate wire with the fourth transistor of the first conductive type, and is located at a position of point symmetry with respect to the first transistor of the second conductive type between the first transistor of the first conductive type and the fourth transistor of the first conductive type, there is a first contact provided in a diffusion layer area of the drain of the first transistor of the first conductive type, there is a second contact provided in a diffusion layer area of the common source/drain between the first and the second transistors of the first conductive type, there is a third contact provided in a diffusion layer area of the source of the second transistor of the first conductive type, there is a fourth contact provided on a gate wire of the first transistor of the first conductive type on the opposite side to the second transistor of the second conductive type, there are a fifth and a sixth contacts provided respectively in a diffusion layer area of the source and that of the drain of the first transistor of the second conductive type, there is a seventh contact provided on the first gate wire between the first transistor of the second conductive type and the third transistor of the first conductive type, there is an eighth contact provided in a diffusion layer area of the drain of the third transistor of the first conductive type, there is a ninth contact provided in a diffusion layer area of the common source/drain between the third and the fourth transistors of the first conductive type, there is a tenth contact provided in a diffusion layer area of the source of the fourth transistor of the first conductive type, there is an eleventh contact provided on a gate wire of the second transistor of the first conductive type on the opposite side to the first transistor of the second conductive type, there are a twelfth and a thirteenth contacts provided respectively in a diffusion layer area of the source and that of the drain of the second transistor of the second conductive type, there is a fourteenth contact provided on the second gate wire between the second transistor of the second conductive type and the first transistor of the first conductive type, the first contact is connected with a replica bit line, the third and the fifth contacts are connected with the first or the second constant voltage source, the fourth contact is connected with the first constant voltage source, the twelfth contact is connected with the second constant voltage source, the sixth and the fourteenth contacts are connected with each other by a first metal wire, the seventh, the ninth, the tenth and the thirteenth contacts are connected with each other by a second metal wire and further with the first constant voltage source, the eighth contact is connected with a replica bit bar line, and the eleventh contact is connected with a word line.

Other circuit layout according to the present invention is the circuit layout of the dummy cell in the semiconductor memory device above. Within the dummy cell, the first and the second transistors of the first conductive type are arranged side by side vertically such that they share a diffusion layer area, the third and the fourth transistors of the first conductive type are arranged, at positions of point symmetry with respect to the first and the second transistors of the first conductive type, side by side vertically such that they share a diffusion layer area, the first transistor of the second conductive type shares a first straight gate wire with the second transistor of the first conductive type, and is located between the second transistor of the first conductive type and the third transistor of the first conductive type yet closer to the second transistor of the first conductive type, the second transistor of the second conductive type shares a second straight gate wire with the fourth transistor of the first conductive type, and is located at a position of point symmetry with respect to the first transistor of the second conductive type between the first transistor of the first conductive type and the fourth transistor of the first conductive type, there is a first contact provided in a diffusion layer area of the drain of the first transistor of the first conductive type, there is a second contact provided in a diffusion layer area of the source of the second transistor of the first conductive type, there is a third contact provided on a gate wire of the first transistor of the first conductive type on the opposite side to the second transistor of the second conductive type, there are a fourth and a fifth contacts provided respectively in a diffusion layer area of the source and that of the drain of the first transistor of the second conductive type, there is a sixth contact provided on the first gate wire between the first transistor of the second conductive type and the third transistor of the first conductive type, there is a seventh contact provided in a diffusion layer area of the drain of the third transistor of the first conductive type, there is an eighth contact provided in a diffusion layer area of the common source/drain between the third and the fourth transistors of the first conductive type, there is a ninth contact provided in a diffusion layer area of the source of the fourth transistor of the first conductive type, there is a tenth contact provided on a gate wire of the second transistor of the first conductive type on the opposite side to the first transistor of the second conductive type, there are an eleventh and a twelfth contacts provided respectively in a diffusion layer area of the source and that of the drain of the second transistor of the second conductive type, there is a thirteenth contact provided on the second gate wire between the second transistor of the second conductive type and the first transistor of the first conductive type, the first contact is connected with a replica bit line, the second and the fourth contacts are connected with the first or the second constant voltage source, the third contact is connected with the first constant voltage source, the eleventh contact is connected with the second constant voltage source, the fifth and the thirteenth contacts are connected with each other by a first metal wire, and the first metal wire extends to an upper layer of the diffusion layer area which is shared by the first and the second transistors of the first conductive type, the sixth, the eighth, the ninth and the twelfth contacts are connected with each other by a second metal wire and further with the first constant voltage source, the seventh contact is connected with a replica bit bar line, and the tenth contact is connected with a word line.

In the semiconductor memory device having the structure above, the dummy cell may have the following structure. That is, the dummy cell comprises a first, a second, a third and a fourth transistors of a first conductive type, a first and a second transistors of a second conductive type, and a first and a second nodes, the drain, the gate and the source of the first transistor of the first conductive type are connected respectively with a replica bit line, a first constant voltage source and the drain of the first transistor of the second conductive type, the drain, the gate and the source of the second transistor of the first conductive type are connected respectively with the first node, the second node and the first constant voltage source, the drain, the gate and the source of the third transistor of the first conductive type are connected respectively with a replica bit bar line, a word line and the second node, the drain, the gate and the source of the fourth transistor of the first conductive type are connected respectively with the second node, the first node and the first constant voltage source, the drain, the gate and the source of the first transistor of the second conductive type are connected respectively with the source of the first transistor of the first conductive type, the second node and the first constant voltage source or a second constant voltage source, the drain, the gate and the source of the second transistor of the second conductive type are connected respectively with the second node, the first node and the second constant voltage source, and the second node is connected with the second constant voltage source.

In the semiconductor memory device having the structure above, the dummy cell may have the following structure. That is, the dummy cell comprises a first, a second, a third and a fourth transistors of a first conductive type, a first transistor of a second conductive type, and a first and a second nodes, the drain, the gate and the source of the first transistor of the first conductive type are connected respectively with a replica bit line, a first constant voltage source and the drain of the second transistor of the first conductive type, the drain, the gate and the source of the second transistor of the first conductive type are connected respectively with the source of the first transistor of the first conductive type, the second node and the first or a second constant voltage source, the drain, the gate and the source of the third transistor of the first conductive type are connected respectively with a replica bit bar line, a word line and the second node, the drain, the gate and the source of the fourth transistor of the first conductive type are connected respectively with the second node, the first node and the first constant voltage source, the drain, the gate and the source of the first transistor of the second conductive type are connected respectively with the second node, the first node and the second constant voltage source, and the second node is connected with the first constant voltage source.

In the semiconductor memory device having the structure above, the dummy cell may have the following structure. That is, the dummy cell comprises a first, a second and a third transistors of a first conductive type, a first and a second transistors of a second conductive type, and a first and a second nodes, the drain, the gate and the source of the first transistor of the first conductive type are connected respectively with a replica bit line, a first constant voltage source and the drain of the first transistor of the second conductive type, the drain, the gate and the source of the second transistor of the first conductive type are connected respectively with a replica bit bar line, a word line and the second node, the drain, the gate and the source of the third transistor of the first conductive type are connected respectively with the second node, the first node and the first constant voltage source, the drain, the gate and the source of the first transistor of the second conductive type are connected respectively with the source of the first transistor of the first conductive type, the second node and the first constant voltage source or a second constant voltage source, the drain, the gate and the source of the second transistor of the second conductive type are connected respectively with the second node, the first node and the second constant voltage source, and the second node is connected with the second constant voltage source.

In the structure above, it is preferable that the replica bit bar line is severed between the connection with the replica cell and the connection with the dummy cell.

In the structure above, it is preferable that the metal wire, the contact or the diffusion layer area which connects the replica bit bar line with the third transistor of the first conductive type of the dummy cell is removed.

In the structure above, it is preferable that there are plural such dummy cells.

In the structure above, it is preferable that the replica cells comprise a transistor which is connected with the replica bit line, and between the replica cells and the dummy cell, there is a cell which has the same structure as those of the replica cells and in which the transistor is off.

In the structure above, it is preferable that the number of such dummy cells is changed depending upon the memory capacity of the memory array.

The semiconductor memory device and the circuit layout according to the present invention attain a remarkable effect of realizing a semiconductor memory device and the like in which a leak current flowing from a replica bit line to dummy cells is suppressed and optimal start-up timing is given to a sense amplifier circuit.

DETAILED DESCRIPTION OF PREFERRED EMBODIMENTS

Preferred embodiments of the present invention will now be described with reference to the associated drawings.

(First Embodiment)

Figure 1:
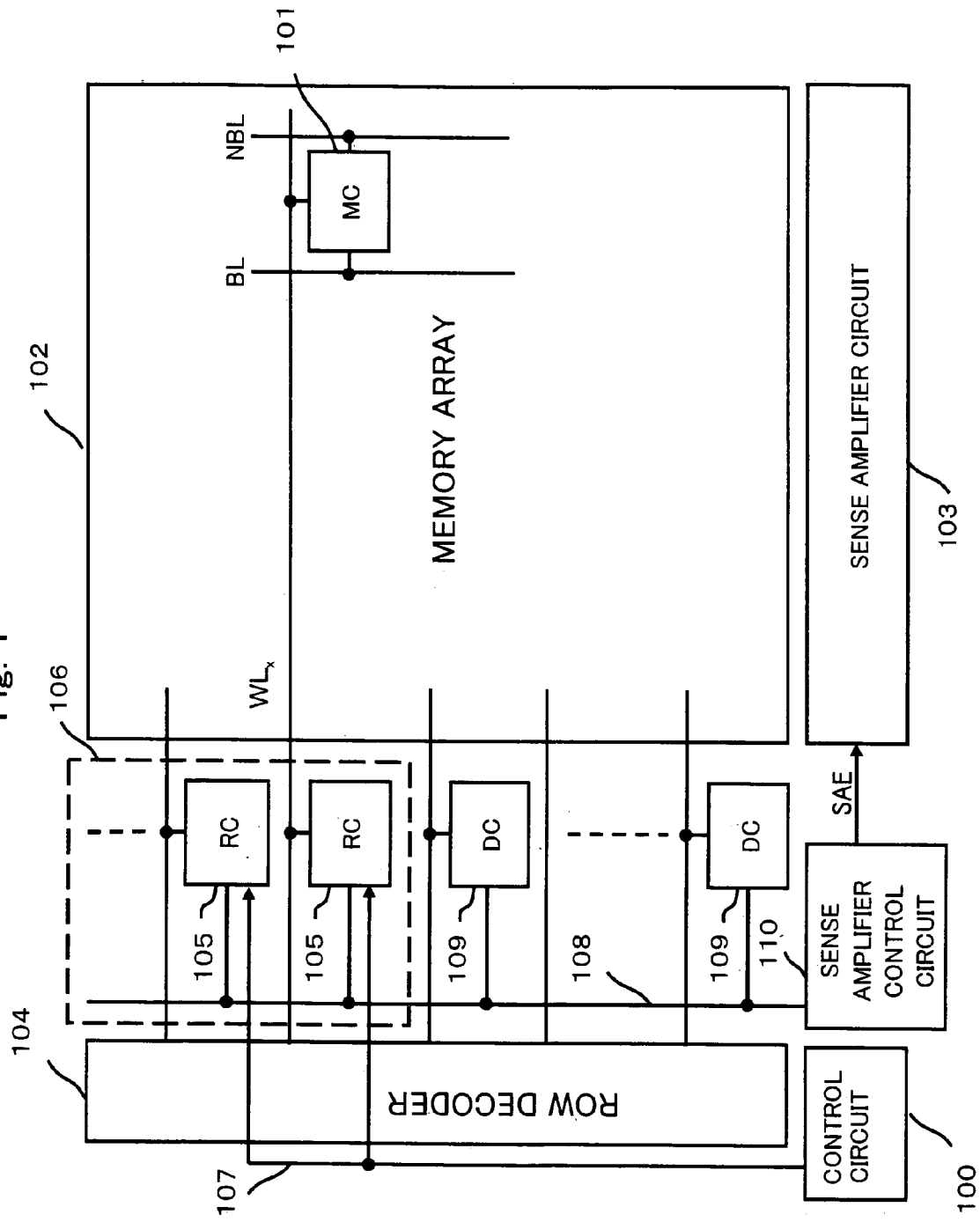
FIG. 1 is a functional block diagram which shows one example of the structure of a semiconductor memory device which uses a replica circuit.
Figure 2:
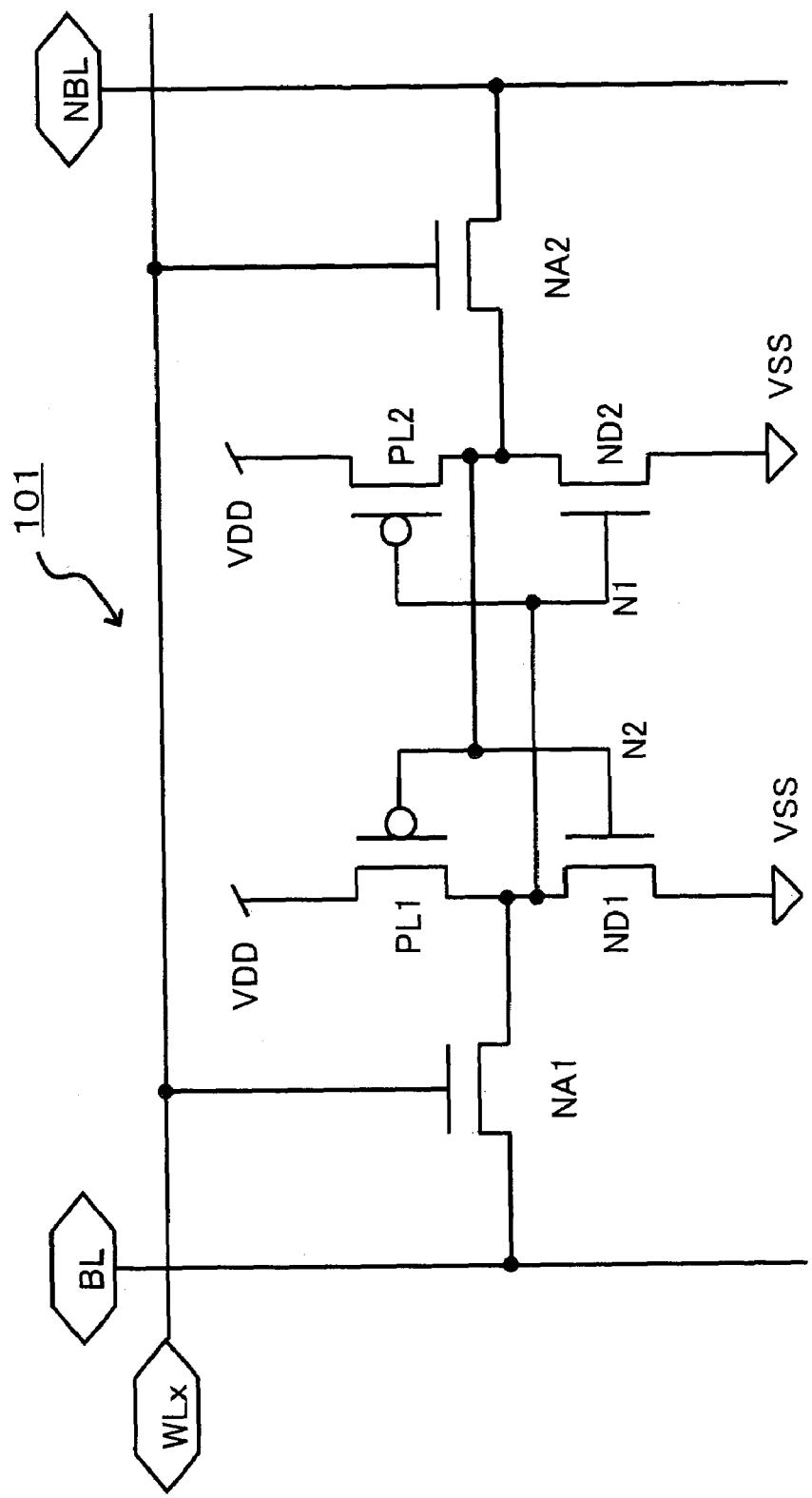
FIG. 2 is a circuitry diagram of an SRAM memory cell.
Figure 3:
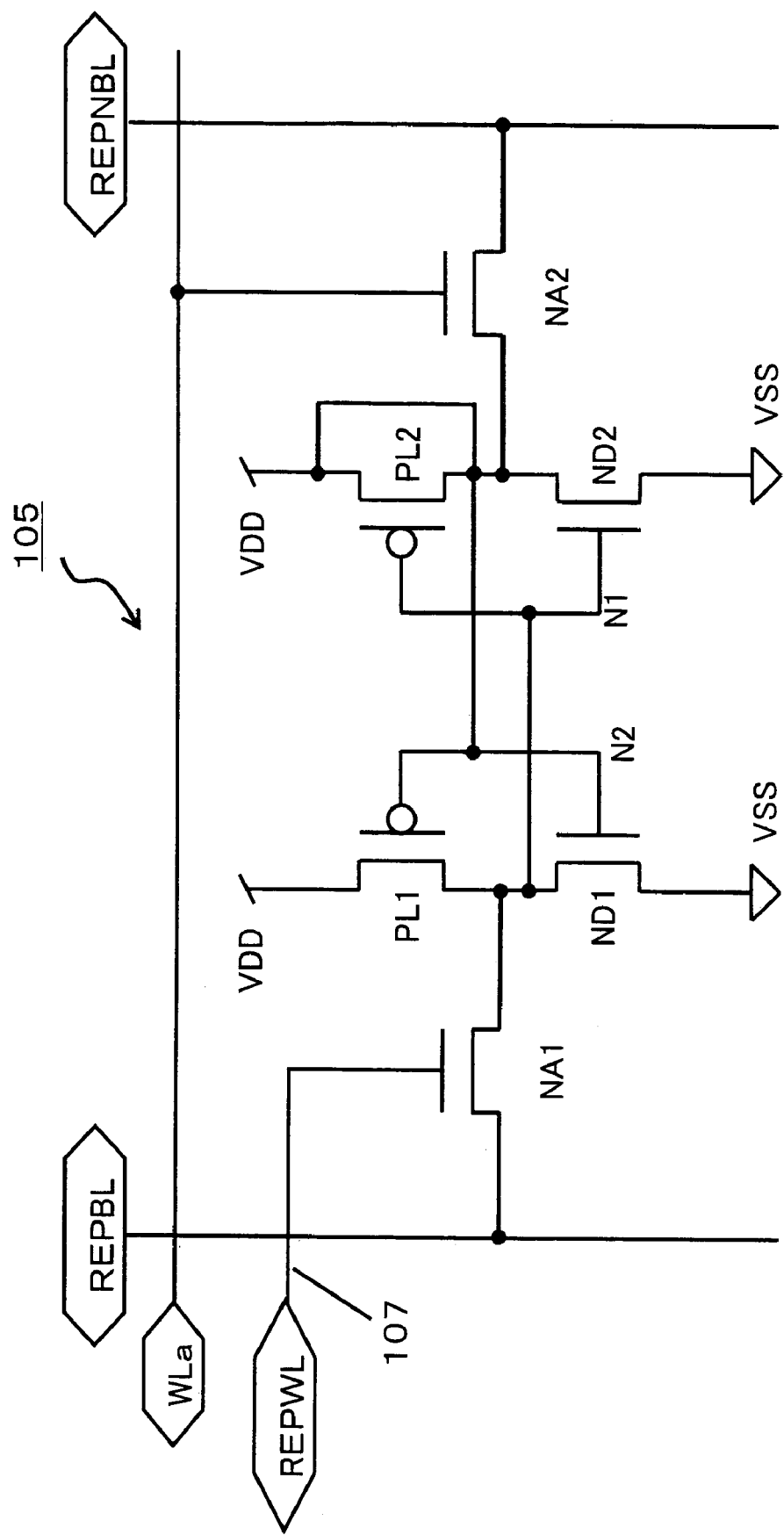
FIG. 3 is a circuitry diagram of a replica cell.
Figure 4:
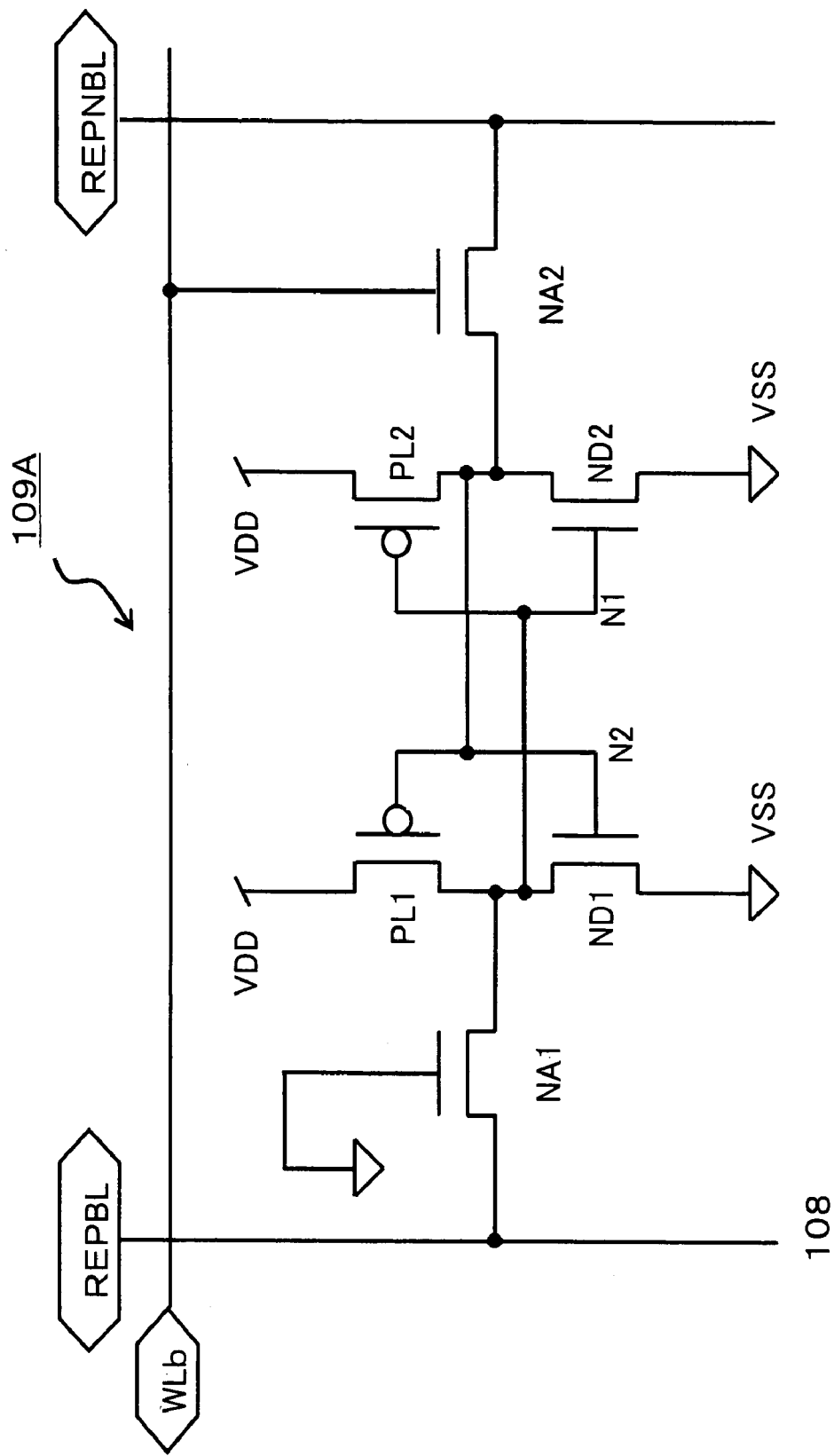
FIG. 4 is a circuitry diagram of a conventional dummy cell.
Figure 5:
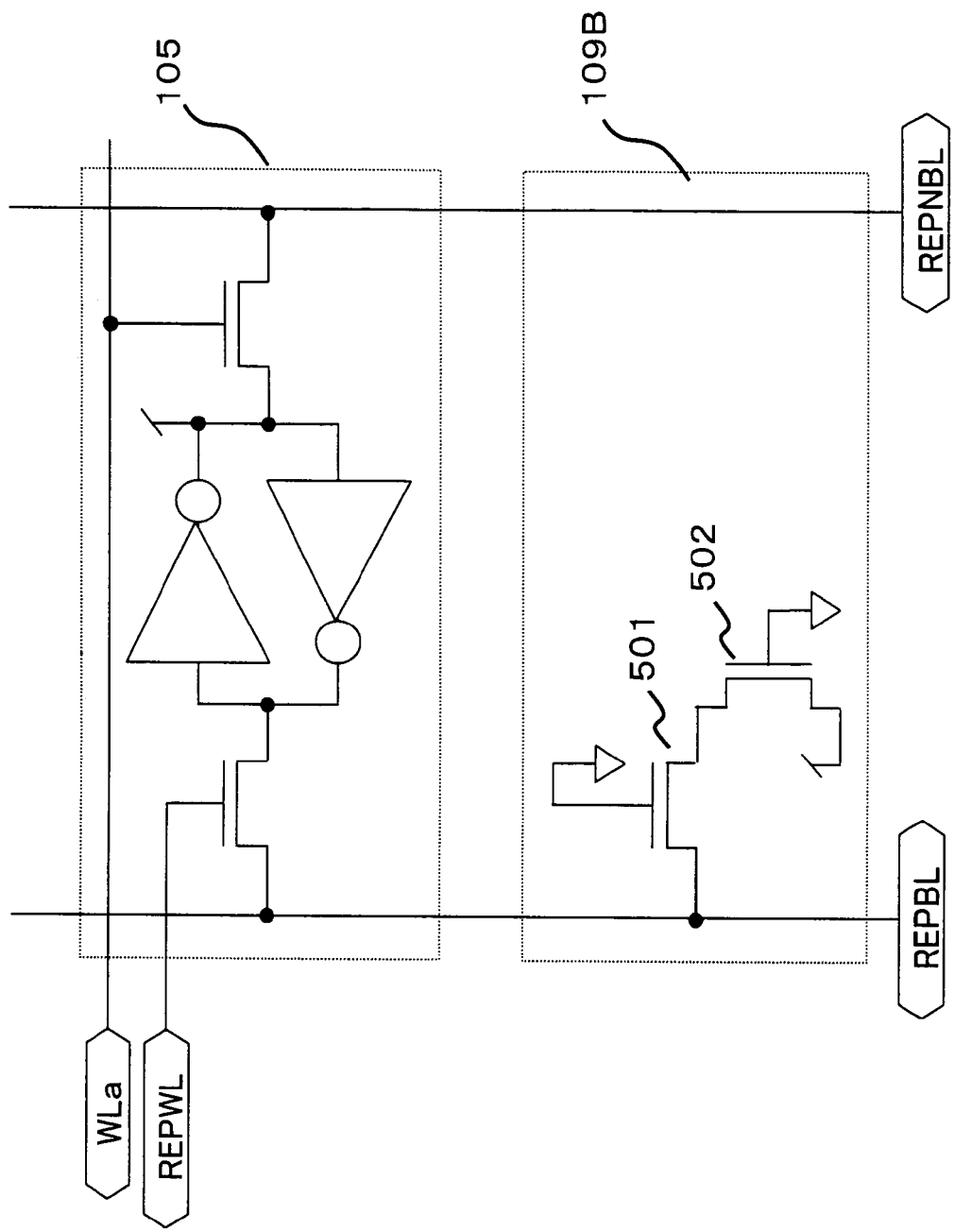
FIG. 5 is a circuitry diagram of a replica cell and a dummy cell in a semiconductor memory device according to a first embodiment of the present invention.

FIG. 5 is a structure diagram of a replica cell 105 and a dummy cell 109B in the semiconductor memory device according to the first embodiment of the present invention.

The dummy cell 109B includes two OFF-state N-type MOS transistors 501 and 502 which are connected in series, and one end of the series circuit formed by the two transistors is connected with the High level while the other end is connected with a replica bit line REPBL.

The dummy cell 109B having this structure will now be described.

Since the two OFF-state transistors are connected in series, it is possible to largely reduce a leak current from the replica bit line REPBL to the dummy cell 109B.

The other structures such as those of memory cells, a sense amplifier and the like are similar to those in the conventional device.

As described above, this embodiment realizes a semiconductor memory device in which a leak current from the replica bit line REPBL to the dummy cell 109B is suppressed and optimal start-up timing is delivered to the sense amplifier circuit, and is thus effective in practical applications.

While the dummy cell 109B includes the two OFF-state transistors 501 and 502 which are connected in series, even when one end of the series circuit formed by the two transistors is connected with the Low level and the other end is connected with the replica bit line REPBL, it is similarly possible to largely reduce a leak current from the replica bit line REPBL to the dummy cell 109B, which practical effect is significant.

Figure 6:
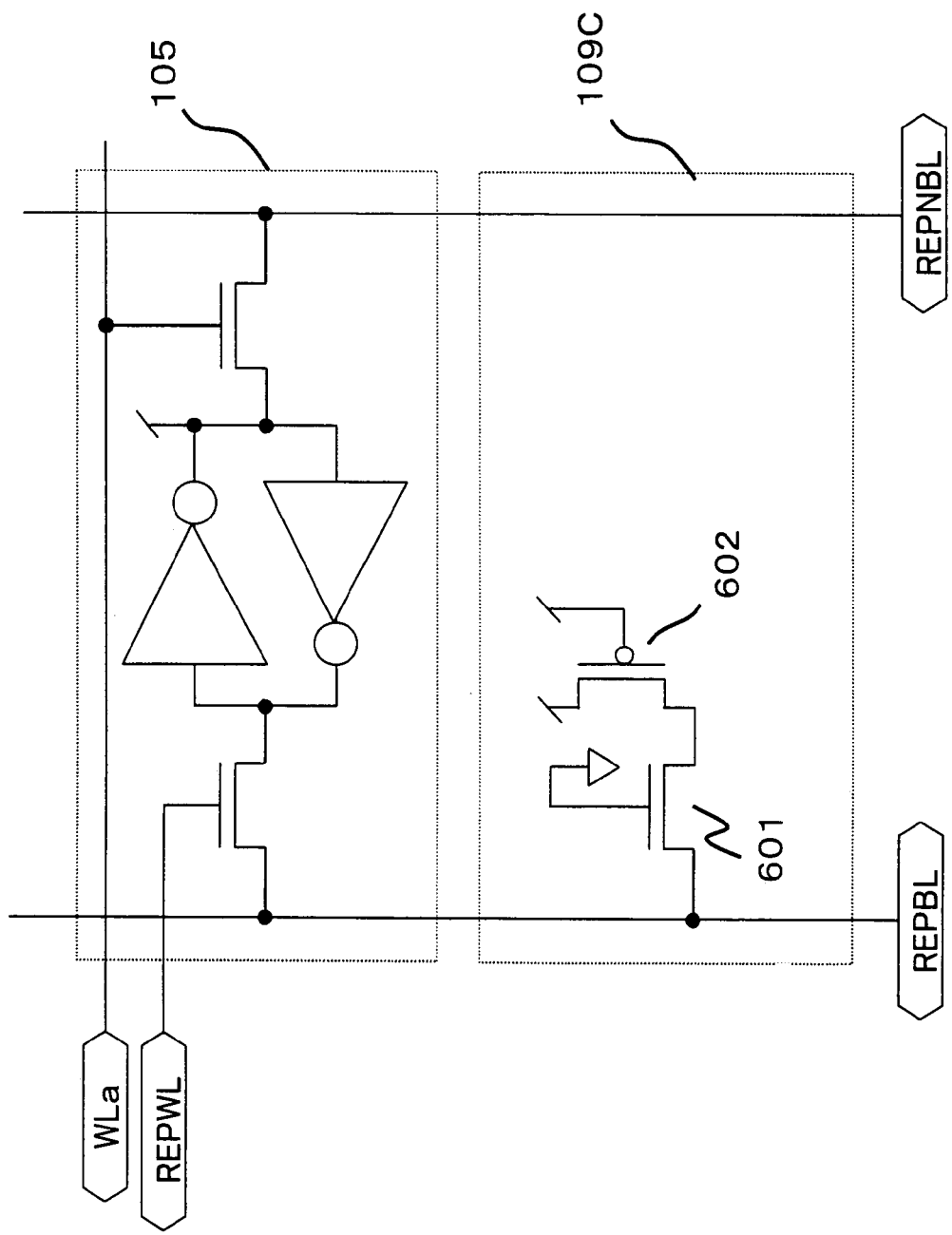
FIG. 6 is a circuitry diagram of the replica cell and other dummy cell in the semiconductor memory device according to the first embodiment of the present invention.

Further, even with a dummy cell 109C as that shown in FIG. 6 where a combination of an N-type MOS transistor 601 and a P-type MOS transistor 602 is used as the two OFF-state transistors, it is similarly possible to largely reduce a leak current from the replica bit line REPBL to the dummy cell 109C, which practical effect is significant.

(Second Embodiment)

Figure 7:
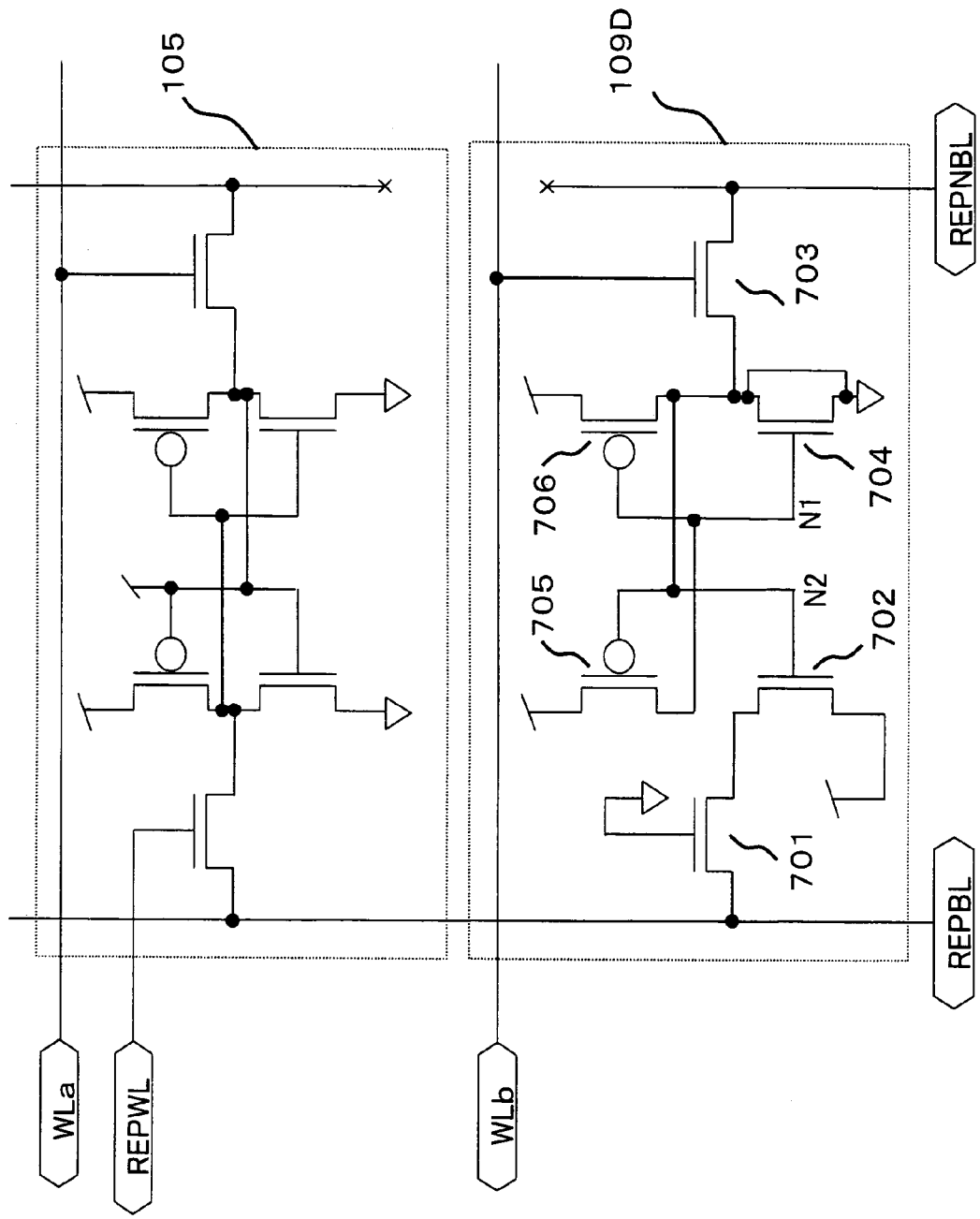
FIG. 7 is a circuitry diagram of a replica cell and a dummy cell in a semiconductor memory device according to a second embodiment of the present invention.

FIG. 7 is a structure diagram of the replica cell 105 and a dummy cell 109D in the semiconductor memory device according to the second embodiment of the present invention.

In FIG. 7, in the semiconductor memory device according to the second embodiment, the dummy cell 109D comprises N-type MOS transistors 701 through 704 and P-type MOS transistors 705 and 706.

The drain, the gate and the source of the N-type MOS transistor 701 are connected respectively with the replica bit line REPBL, the Low level and the drain of the N-type MOS transistor 702.

The drain, the gate and the source of the N-type MOS transistor 702 are connected respectively with the source of the N-type MOS transistor 701, a second node N2 and the High level.

The drain, the gate and the source of the N-type MOS transistor 703 are connected respectively with a replica bit bar line REPNBL, a word line WLb and the second node N2.

The drain, the gate and the source of the N-type MOS transistor 704 are connected respectively with the second node N2, a first node N1 and the Low level.

The drain, the gate and the source of the P-type MOS transistor 705 are connected respectively with the first node N1, the second node N2 and the High level.

The drain, the gate and the source of the P-type MOS transistor 706 are connected respectively with the second node N2, the first node N1 and the High level.

The second node N2 is connected with the Low level, and the replica bit bar line REPNBL is severed between the connection with the replica cell 105 and the connection with the dummy cell 109D.

The dummy cell 109D having this structure will now be described.

The dummy cell 109D connects, by means of a circuit formed by the series-connected OFF-state N-type MOS transistors 701 and 702, between the replica bit line REPBL and the High level. This makes it possible to largely reduce a leak current from the replica bit line REPBL to the dummy cell 109D. In addition, use of the same transistors as those of the memory cells 101 achieves approximately the same optical layout as those of the surrounding structures and hence improves the production yield of the semiconductor memory device, which practical effect is significant.

Further, the replica cell 105 and the dummy cell 109D are connected respectively with the word lines WLa and WLb. Due to this, while data are read to the replica bit bar line REPNBL every time the word lines WLa and WLb are chosen, since the replica cell 105 and the dummy cell 109D hold different data, a great current flows between the replica cell 105 and the dummy cell 109D from the replica bit bar line REPNBL. Noting this, in the present invention, the replica bit bar line REPNBL is severed between the connection with the replica cell 105 and the connection with the dummy cell 109D. An alternative approach is removal of a metal wire, contact or diffusion layer area which connects the N-type MOS transistor 703 with the replica bit bar line REPNBL.

(Third Embodiment)

Figure 8:
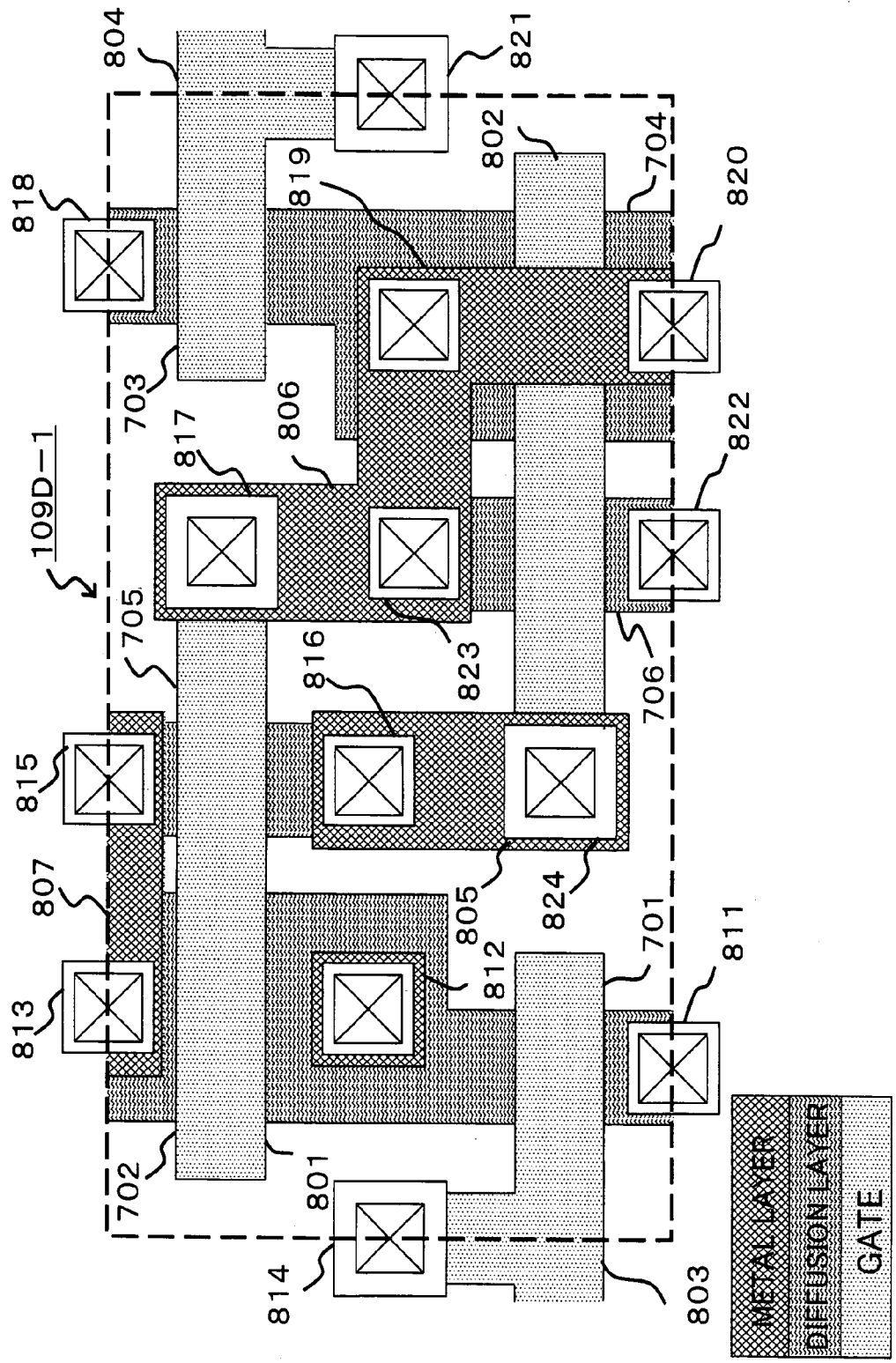
FIG. 8 is an explanatory diagram which shows one example of the layout of a dummy cell 109D in a semiconductor memory device according to a third embodiment of the present invention.

FIG. 8 shows a specific example of the layout of a dummy cell 109D-1 in the semiconductor memory device according to the third embodiment.

In FIG. 8, in the semiconductor memory device according to the third embodiment, the N-type MOS transistors 701 and 702 are arranged side by side vertically such that they share a diffusion layer area.

The N-type MOS transistors 703 and 704 are arranged side by side vertically such that they share a diffusion layer area, at positions of point symmetry with respect to the N-type MOS transistors 701 and 702.

The P-type MOS transistor 705 shares a straight gate wire 801 with the N-type MOS transistor 702, and is located between the N-type MOS transistor 702 and the N-type MOS transistor 703 yet closer to the N-type MOS transistor 702.

The P-type MOS transistor 706 shares a straight gate wire 802 with the N-type MOS transistor 704, and is located at a position of point symmetry with respect to the P-type MOS transistor 705 between the N-type MOS transistor 701 and the N-type MOS transistor 704.

In this semiconductor memory device, there is a contact 811 in the diffusion layer area of the drain of the N-type MOS transistor 701. Further, there is a contact 812 in the diffusion layer area of the common source/drain between the N-type MOS transistors 701 and 702. Further, there is a contact 813 in the diffusion layer area of the source of the N-type MOS transistor 702. Further, there is a contact 814 on a gate wire 803 of the N-type MOS transistor 701 on the opposite side to the P-type MOS transistor 706. Further, there are contacts 815 and 816 respectively in the diffusion layer area of the source and the drain of the P-type MOS transistor 705. Further the gate wire 801 has a contact 817 between the P-type MOS transistor 705 and the N-type MOS transistor 703. Further, there is a contact 818 in the diffusion layer area of the drain of the N-type MOS transistor 703. Further, there is a contact 819 in the diffusion layer area of the common source/drain between the N-type MOS transistors 703 and 704. Further, there is a contact 820 in the diffusion layer area of the source of the N-type MOS transistor 704. Further, there is a contact 821 on a gate wire 804 of the N-type MOS transistor 703 on the opposite side to the P-type MOS transistor 705. Further, there are contacts 822 and 823 respectively in the diffusion layer area of the source and the drain of the P-type MOS transistor 706. Further the gate wire 802 has a contact 824 between the P-type MOS transistor 706 and the N-type MOS transistor 701.

The contact 811 is connected with the replica bit line in a different layer than the first layer via a contact and a metal wire. The contacts 813 and 815 are connected with a first constant voltage source (Low level) or a second contact voltage source (High level) in a different layer than the first layer via a contact and a metal wire 807. The contact 814 is connected with the first constant voltage source in a different layer than the first layer via a contact and a metal wire. The contact 822 is connected with the second constant voltage source in a different layer than the first layer via a contact and a metal wire. The contacts 816 and 824 are connected with each other by the metal wire 805 in the first layer, while the contacts 817, 819, 820 and 823 are connected with each other by the metal wire 806 in the first layer, and further with the first constant voltage source in a different layer than the first layer via a contact and a metal wire. The contact 818 is connected with the replica bit bar line REPNBL in a different layer than the first layer via a contact and a metal wire. The contact 821 is connected with the word line WLb in a different layer than the first layer via a contact and a metal wire.

The dummy cell 109D-1 having this structure will now be described. In FIG. 8, the diffusion layer areas, the gate wires and the contacts usually have the same structures with those of the SRAM memory cells. This improves the production yield of the semiconductor memory device, which practical effect is significant.

(Fourth Embodiment)

Figure 9:
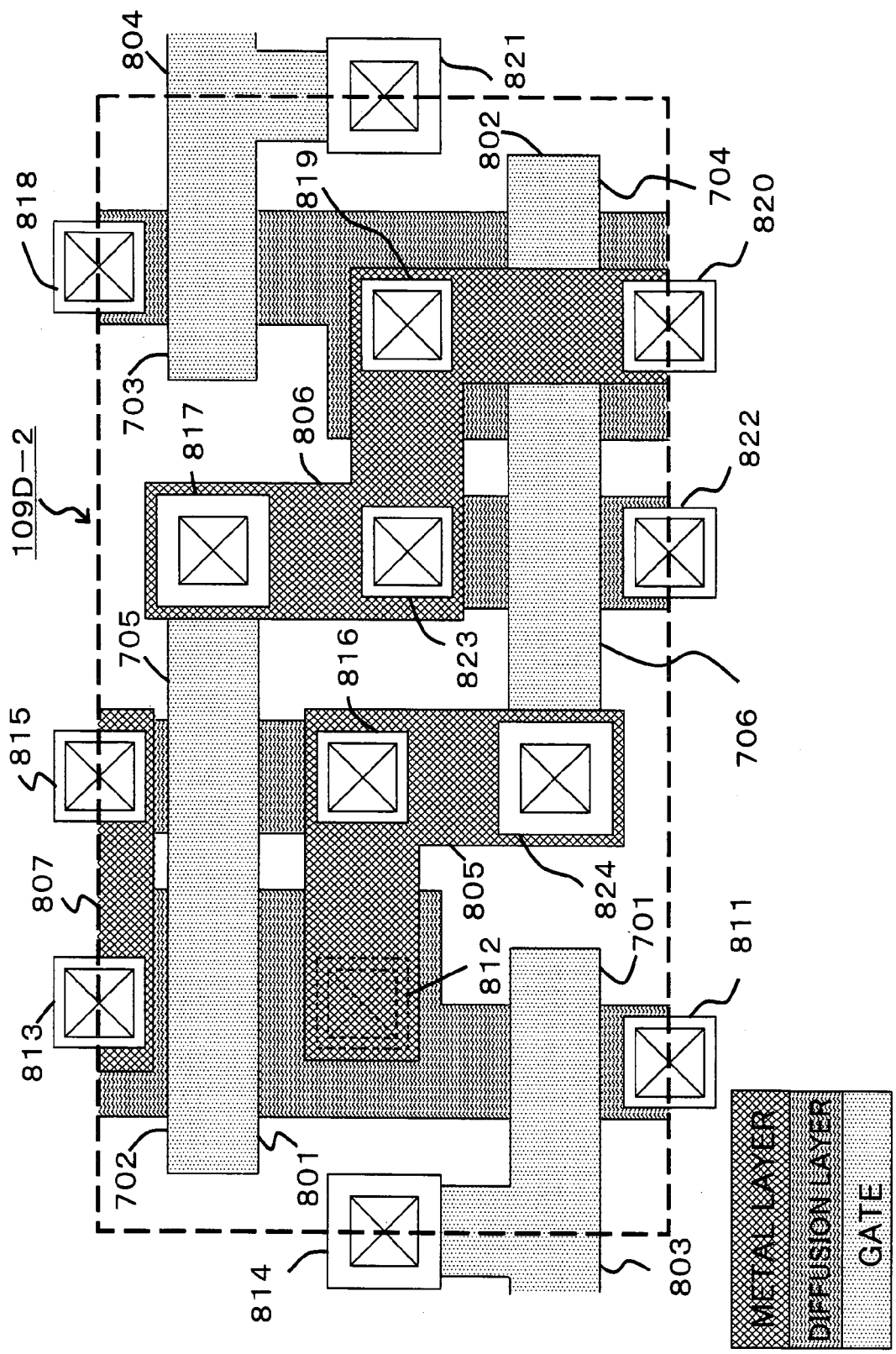
FIG. 9 is an explanatory diagram which shows other example of the layout of the dummy cell 109D in a semiconductor memory device according to a fourth embodiment of the present invention.

FIG. 9 shows a specific example of the layout of a dummy cell 109D-2 in the semiconductor memory device according to the fourth embodiment.

In FIG. 9, unlike in the third embodiment, the semiconductor memory device according to the fourth embodiment has structure that a metal wire provides a connection between the contacts 812 and 816, thereby omitting the contact 812. The other structures are similar to those according to the third embodiment.

The dummy cell 109D-2 having this structure will now be described. In the third embodiment, since the metal layer is disposed only over a small area in the contact 812, the production yield of the semiconductor memory device could be influenced. Noting this, the third embodiment achieves the dummy cell 109D-2 which is exclusive of the contact 812.

As described above, the fourth embodiment improves the production yield of the semiconductor memory device, which practical effect is significant.

(Fifth Embodiment)

Figure 10:
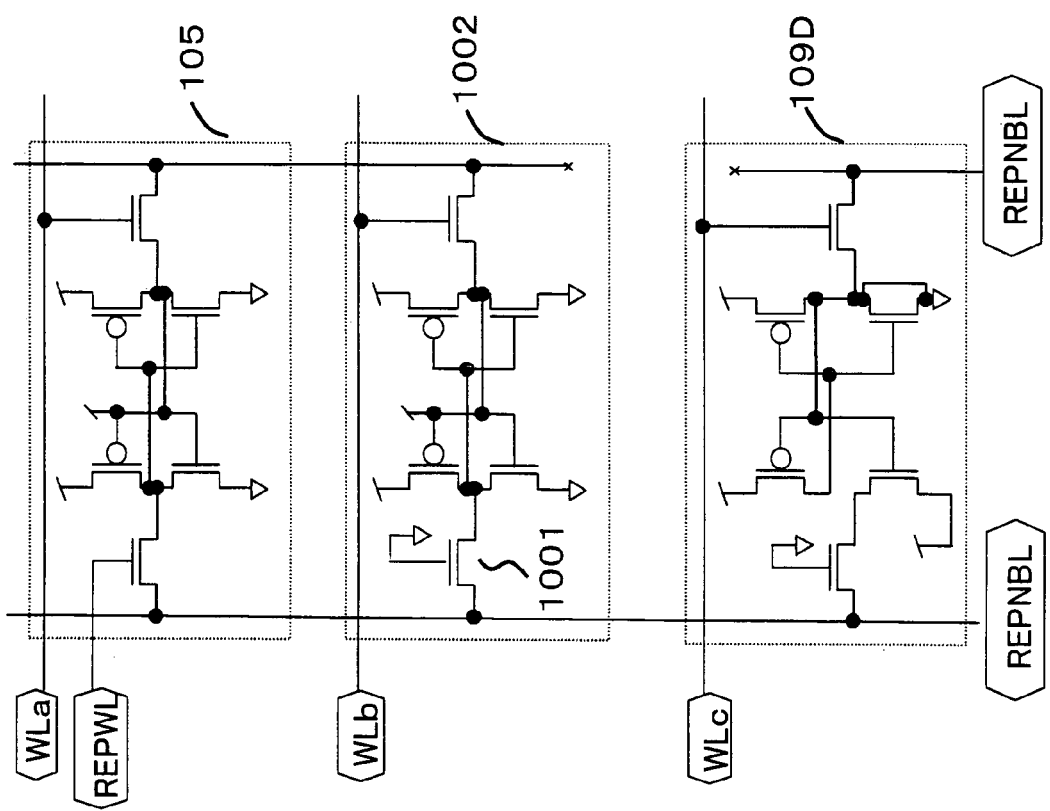
FIG. 10 is a circuitry diagram of a replica cell 105, the dummy cell 109D and a cell 1002, which is disposed between the replica cell 105 and the dummy cell 109D and has the same structure as the structure of the replica cell 105 except that an N-type MOS transistor 1001 is in the OFF-state, in a semiconductor memory device according to a fifth embodiment of the present invention.

FIG. 10 shows an example of the structure of the semiconductor memory device according to the fifth embodiment of the present invention.

In FIG. 10, the semiconductor memory device according to the fifth embodiment comprises the replica cell 105, the dummy cell 109D and the cell 1002 which is located between the replica cell 105 and the dummy cell 109D, which has the same structure as that of the replica cell 105 and in which N-type MOS transistor 1001 is in the OFF-state.

The semiconductor memory device having the structure above will now be described. In the third and the fourth embodiments, the contact 813 is connected with the contact 815 and hence with the High level. If the replica cell 105 is disposed on the dummy cell 109D, the replica cell can not cause transition of the potential on the replica bit line REPBL.

In light of this, the cell 1002, whose structure is the same as that of the replica cell 105 and in which N-type MOS transistor 1001 is in the OFF-state, is inserted between the replica cell 105 and the dummy cell 109D. This permits the replica cell to operate correctly, thereby causing correct transition of the potential on the replica bit line REPBL. While this brings about a leak current from the replica bit line REPBL to this cell, since the leak current is insubstantial as compared to the overall current, there is not influence over transition of the potential on the replica bit line REPBL.

As described above, the fifth embodiment realizes a semiconductor memory device in which a leak current from the replica bit line REPBL to the dummy cell 109D is suppressed and optimal start-up timing is delivered to the sense amplifier circuit, which practical effect is significant.

This embodiment is applicable also to the following embodiments.

(Sixth Embodiment)

Figure 11:
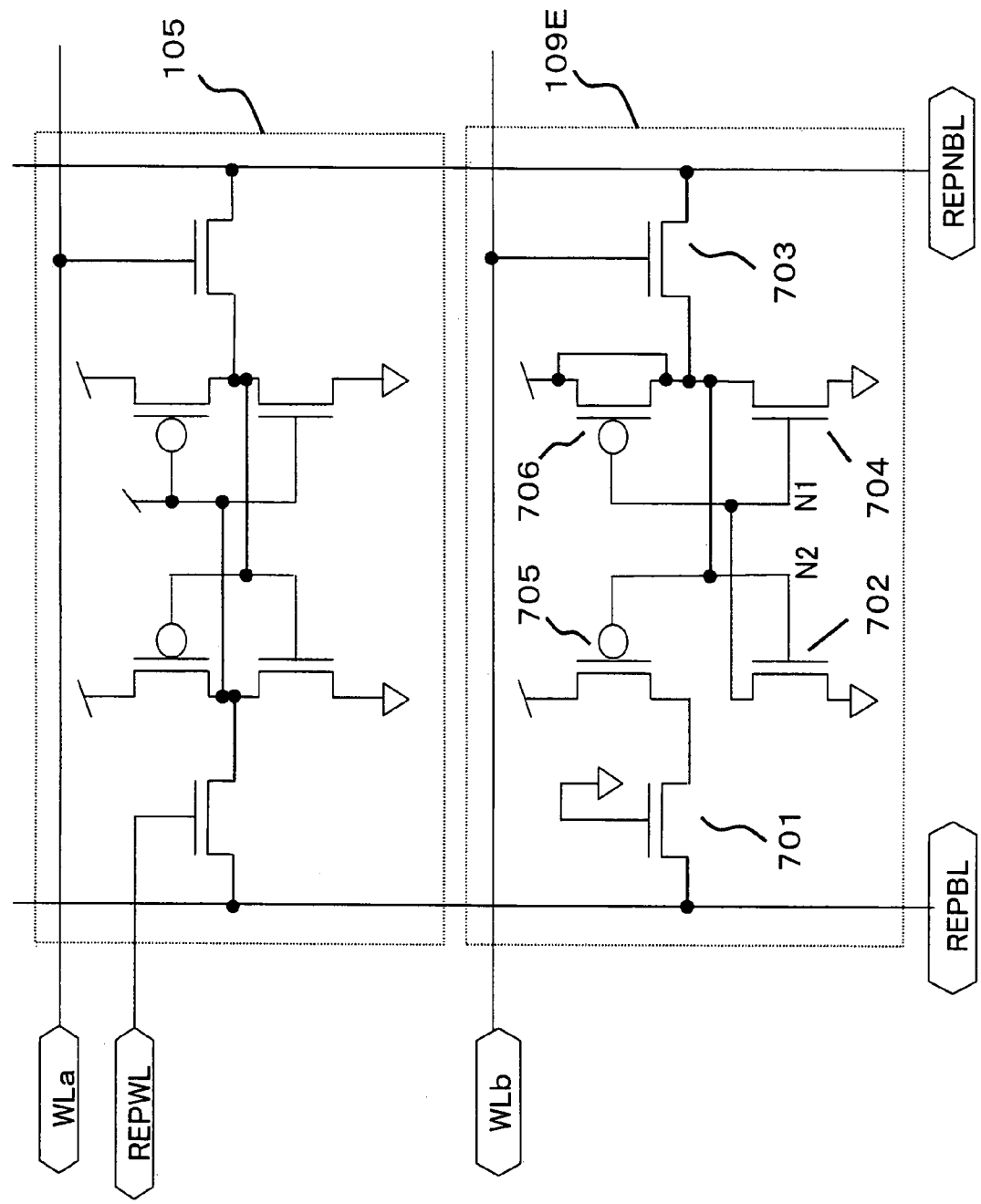
FIG. 11 is a circuitry diagram of the replica cell 105 and a dummy cell 109E in a semiconductor memory device according to a sixth embodiment of the present invention.

FIG. 11 shows an example of the structure of the semiconductor memory device according to the sixth embodiment of the present invention.

In FIG. 11, the semiconductor memory device according to the sixth embodiment, a dummy cell 109E comprises the N-type MOS transistors 701 through 704 and the P-type MOS transistors 705 and 706.

The drain, the gate and the source of the N-type MOS transistor 701 are connected respectively with the replica bit line REPBL, the Low level and the drain of the N-type MOS transistor 705.

The drain, the gate and the source of the N-type MOS transistor 702 are connected respectively with the first node N1, the second node N2 and the Low level.

The drain, the gate and the source of the N-type MOS transistor 703 are connected respectively with the replica bit bar line REPNBL, the word line WLb and the second node N2.

The drain, the gate and the source of the N-type MOS transistor 704 are connected respectively with the second node N2, the first node N1 and the Low level.

The drain, the gate and the source of the P-type MOS transistor 705 are connected respectively with the source of the N-type MOS transistor 701, the second node N2 and the High level.

The drain, the gate and the source of the P-type MOS transistor 706 are connected respectively with the second node N2, the first node N1 and the High level.

The second node N2 is connected with the High level.

The dummy cell 109E having the structure above will now be described.

In the dummy cell 109E, a circuit formed by the N-type MOS transistor 701 and the P-type MOS transistor 705 which are in the OFF-state and connected in series connects between the replica bit bar line REPNBL and the High level. This makes it possible to largely reduce a leak current from the replica bit line REPBL to the dummy cell 109E. In addition, use of the same transistors as those of the memory cells 101 achieves approximately the same optical layout as those of the surrounding structures and hence improves the production yield of the semiconductor memory device, which practical effect is significant.

(Seventh Embodiment)

Figure 12:
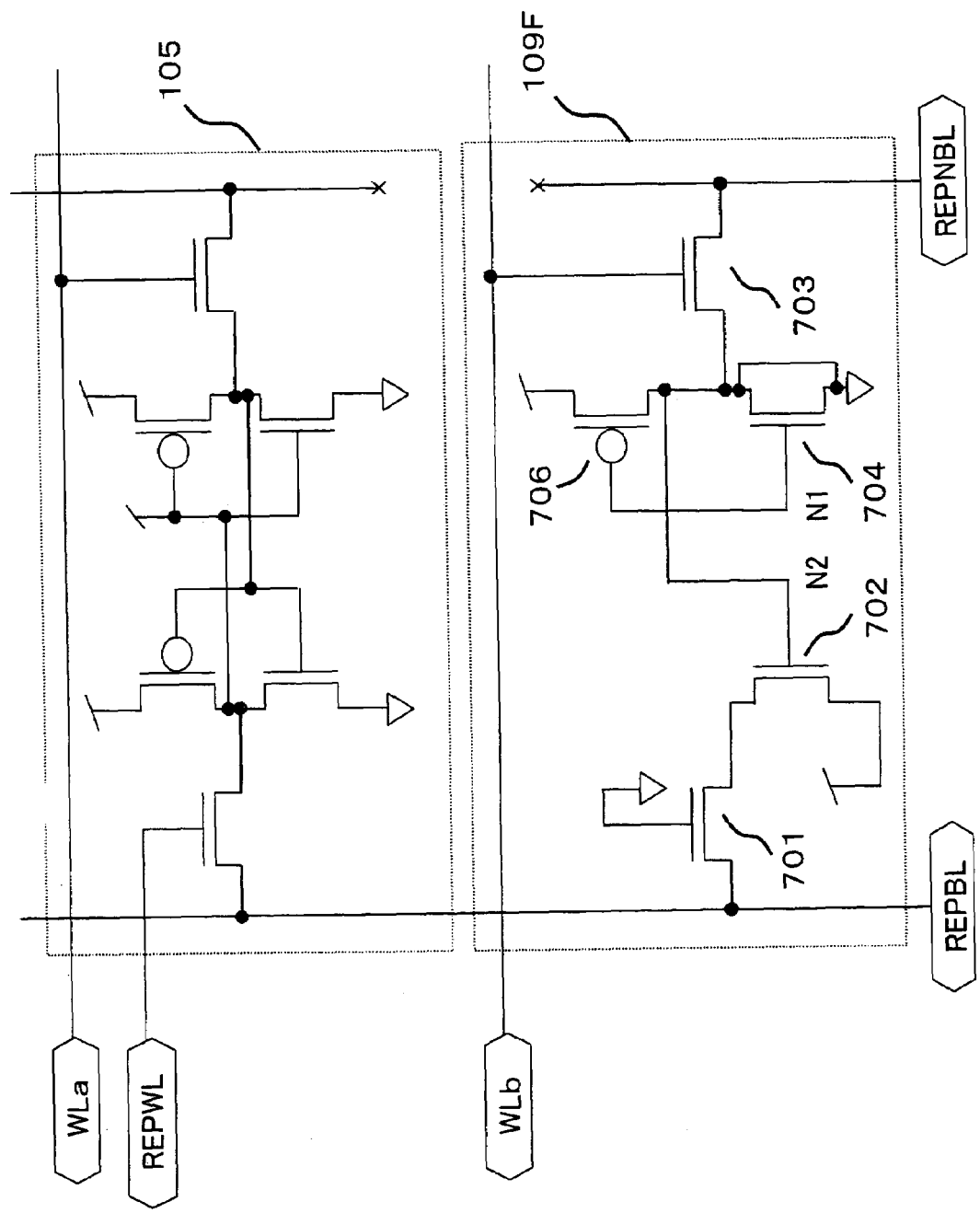
FIG. 12 is a circuitry diagram of the replica cell 105 and a dummy cell 109F in a semiconductor memory device according to a seventh embodiment of the present invention.

FIG. 12 shows an example of the structure of the semiconductor memory device according to the seventh embodiment of the present invention.

In FIG. 12, the semiconductor memory device according to the seventh embodiment is exclusive of the P-type MOS transistor 705 of the second embodiment of the present invention. In the seventh embodiment, the series-connected OFF-state N-type MOS transistors 701 and 702 connect between the replica bit line and the High level. This realizes a semiconductor memory device in which a leak current from the replica bit line REPBL to the dummy cell 109F is suppressed and optimal start-up timing is delivered to the sense amplifier circuit, which practical effect is significant.

(Eighth Embodiment)

Figure 13:
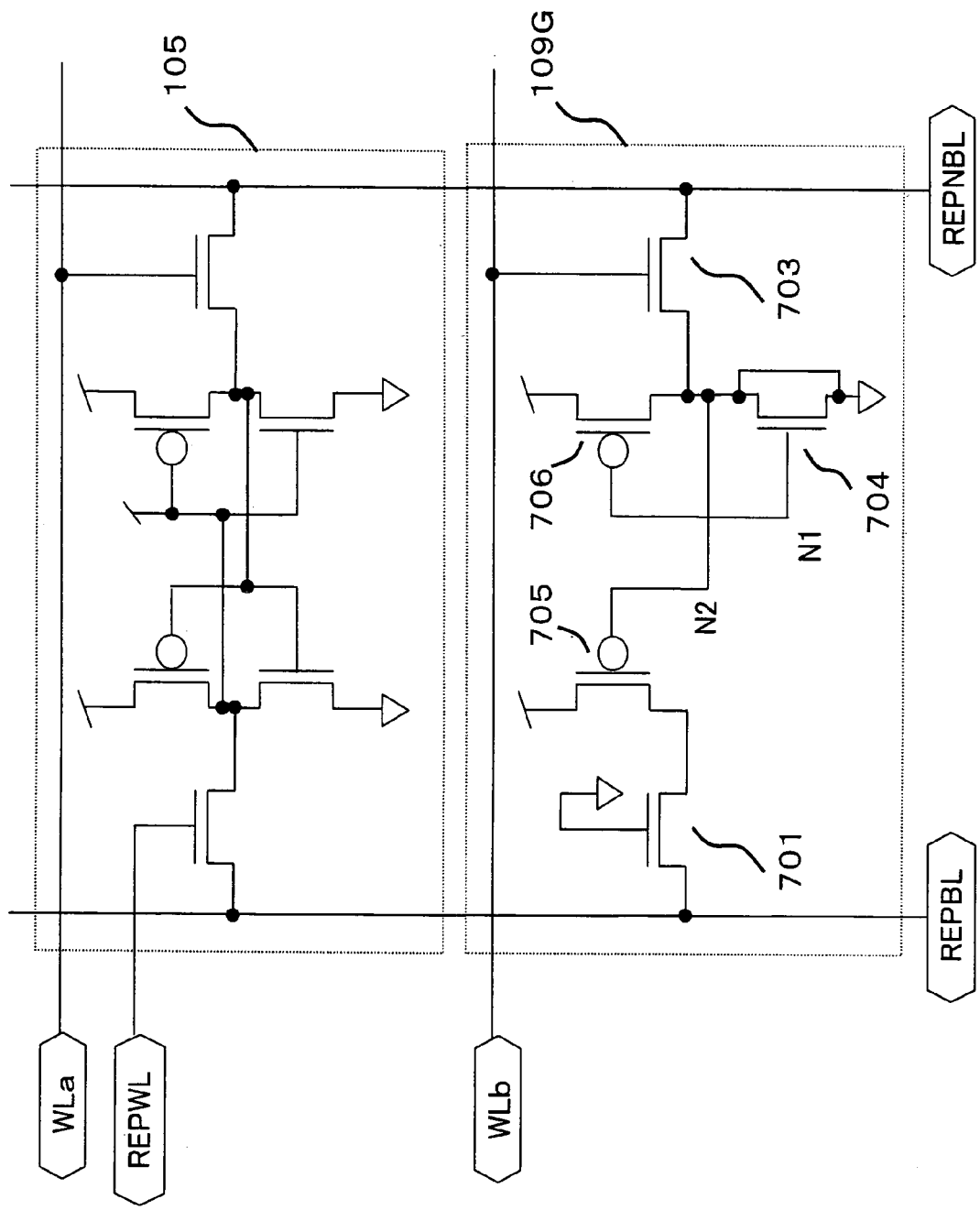
FIG. 13 is a circuitry diagram of the replica cell 105 and a dummy cell 109G in a semiconductor memory device according to an eighth embodiment of the present invention.

FIG. 13 shows an example of the structure of the semiconductor memory device according to the eighth embodiment of the present invention.

In FIG. 13, the semiconductor memory device according to the eighth embodiment is exclusive of the P-type MOS transistor 702 of the sixth embodiment of the present invention. In the eighth embodiment, the series-connected OFF-state N-type MOS transistors 701 and 702 connect between the replica bit line REPBL and the High level. This realizes a semiconductor memory device in which a leak current from the replica bit line REPBL to a dummy cell 109G is suppressed and optimal start-up timing is delivered to the sense amplifier circuit, which practical effect is significant.

(Ninth Embodiment)

Figure 14:
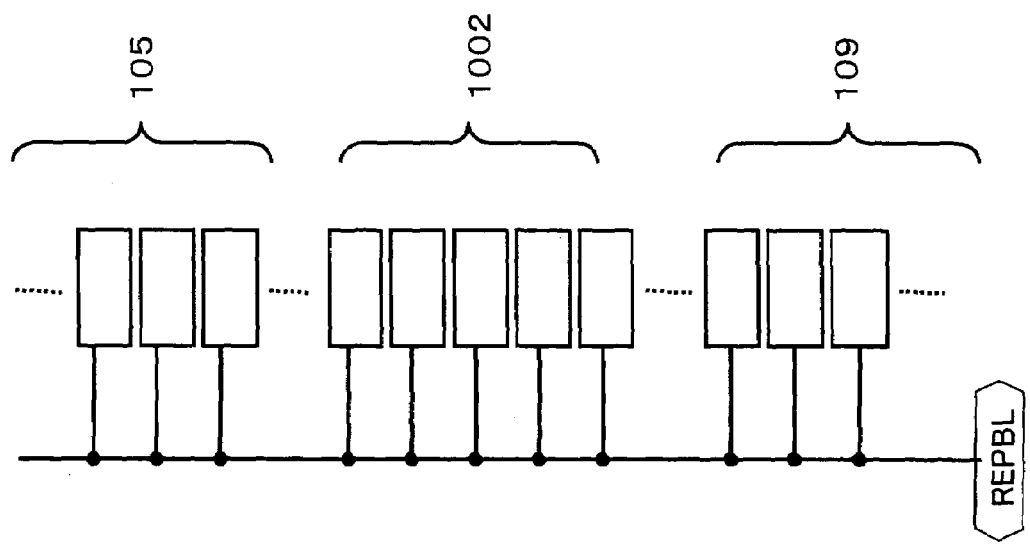
FIG. 14 is an interconnections diagram of multiple replica cells 105, multiple cells 1002 and dummy cells 109 in a semiconductor memory device according to a ninth embodiment of the present invention.

FIG. 14 shows an example of the structure of the semiconductor memory device according to the ninth embodiment of the present invention.

In FIG. 14, in the semiconductor memory device according to the ninth embodiment, connected with the replica bit line REPBL are plural replica cells 105, plural dummy cells 109 and plural cells 1002 (FIG. 10) whose structures are the same as those of the replica cells 105 and in which N-type MOS transistors 1001 are in the OFF-state.

The semiconductor memory device having the structure above will now be described.

Under the influence of the capacities, the resistances and the like of the bit lines BL and NBL, the timing at which start-up of the sense amplifier circuit 103 is desired does not transit the same way as the timing at which the replica circuit 106 makes the replica bit line REPBL transit from the High level to the Low level, because of differences in terms of memory capacity and particularly the number of rows in the memory array. For alignment of the two timing therefore, it is necessary to change the number of the replica cells 105 in the replica circuit 106 to change the timing created by the replica circuit 106. Despite this, even a change of the number of the replica cells 105 merely by one greatly changes this timing, and it is therefore impossible to obtain the timing at which start-up of the sense amplifier circuit 103 is desired. Noting this, the cells 1002, whose structures are the same as those of the replica cells 105 and in which N-type MOS transistors 1001 are in the OFF-state, are intentionally inserted. The cells 1002 have leakage.

As described above, intentional insertion of the cells 1002 whose structures are the same as those of the plural replica cells 105 and in which N-type MOS transistors 1001 are in the OFF-state, namely, the cells 1002 having leakage makes it possible to obtain a semiconductor memory device in which optimal start-up timing is given to the sense amplifier circuit, which practical effect is significant.

In each embodiment above, it is preferable that an access transistor and a drive transistor are the two series-connected OFF-state transistors.

In this case, it is desirable that the layout of the dummy cells is approximately the same as that of the memory cells and that removal of metal wires insulates the load transistors on the dummy bit line from the access transistors and the drive transistors.

Alternatively, the layout of the dummy cells is preferably approximately the same as that of the memory cells and removal of contacts preferably insulates the load transistors on the dummy bit line from the access transistors and the drive transistors.

In this case, the load transistors on the dummy bit line may be removed.

Alternatively, an access transistor and a load transistor are preferably the two series-connected OFF-state transistors.

In this case, the drive transistors on the dummy bit line may be removed.

INDUSTRIAL APPLICABILITY

The semiconductor memory device and the circuit layout according to the present invention are useful as a semiconductor memory device and a circuit layout owing to the effect that suppression of a leak current from the replica bit line to the dummy cells attains delivery of optimal start-up timing to the sense amplifier circuit, useful for an SRAM and the like, and applicable also to a ROM, etc.

The invention claimed is:

1. A semiconductor memory device, comprising:
    a memory array including plural memory cells;
    a sense amplifier circuit which amplifies data read from one memory cell of said memory array to a bit line;
    a replica circuit which includes plural stages of replica cells having the same elements as said plural memory cells and connected with a common replica bit line, and which outputs to said common replica bit line a signal which is at a level which corresponds to the number of said plural stages of replica cells;
    a dummy cell which is connected as a load with said common replica bit line; and
    a sense amplifier control circuit which receives said signal on said replica bit line and controls the timing of a signal which starts up said sense amplifier circuit,
    wherein said dummy cell includes a series circuit which is formed by at least two OFF-state transistors, one end of said series circuit which is formed by said at least two OFF-state transistors is connected with a constant voltage source, and the other end of said series circuit is connected with said common replica bit line.

2. The semiconductor memory device of claim 1, wherein said series circuit which is formed by said at least two OFF-state transistors is a series circuit of transistors of a first conductive type.

3. The semiconductor memory device of claim 1, wherein said series circuit which is formed by said at least two OFF-state transistors is a series circuit of a transistor of a first conductive type and a transistor of a second conductive type.

4. The semiconductor memory device of claim 1, wherein said dummy cell comprises a first, a second, a third and a fourth transistors of a first conductive type, a first and a second transistors of a second conductive type, and a first and a second nodes,
    the drain, the gate and the source of said first transistor of said first conductive type are connected respectively with a replica bit line, a first constant voltage source and the drain of said second transistor of said first conductive type,
    the drain, the gate and the source of said second transistor of said first conductive type are connected respectively with the source of said first transistor of said first conductive type, said second node and said first constant voltage source or a second constant voltage source,
    the drain, the gate and the source of said third transistor of said first conductive type are connected respectively with a replica bit bar line, a word line and said second node,
    the drain, the gate and the source of said fourth transistor of said first conductive type are connected respectively with said second node, said first node and said first constant voltage source,
    the drain, the gate and the source of said first transistor of said second conductive type are connected respectively with said first node, said second node and said second constant voltage source,
    the drain, the gate and the source of said second transistor of said second conductive type are connected respectively with said second node, said first node and said second constant voltage source, and
    said second node is connected with said first constant voltage source.

5. The circuit layout of said dummy cell in the semiconductor memory device of claim 4, wherein within said dummy cell, said first and said second transistors of said first conductive type are arranged side by side vertically such that they share a diffusion layer area, said third and said fourth transistors of said first conductive type are arranged, at positions of point symmetry with respect to said first and said second transistors of said first conductive type, side by side vertically such that they share a diffusion layer area, said first transistor of said second conductive type shares a first straight gate wire with said second transistor of said first conductive type, and is located between said second transistor of said first conductive type and said third transistor of said first conductive type yet closer to said second transistor of said first conductive type, said second transistor of said second conductive type shares a second straight gate wire with said fourth transistor of said first conductive type, and is located at a position of point symmetry with respect to said first transistor of said second conductive type between said first transistor of said first conductive type and said fourth transistor of said first conductive type, there is a first contact provided in a diffusion layer area of the drain of said first transistor of said first conductive type, there is a second contact provided in a diffusion layer area of the common source/drain between said first and said second transistors of said first conductive type, there is a third contact provided in a diffusion layer area of the source of said second transistor of said first conductive type, there is a fourth contact provided on a gate wire of said first transistor of said first conductive type on the opposite side to said second transistor of said second conductive type, there are a fifth and a sixth contacts provided respectively in a diffusion layer area of the source and that of the drain of said first transistor of said second conductive type, there is a seventh contact provided on said first gate wire between said first transistor of said second conductive type and said third transistor of said first conductive type, there is an eighth contact provided in a diffusion layer area of the drain of said third transistor of said first conductive type, there is a ninth contact provided in a diffusion layer area of the common source/drain between said third and said fourth transistors of said first conductive type, there is a tenth contact provided in a diffusion layer area of the source of said fourth transistor of said first conductive type, there is an eleventh contact provided on a gate wire of said second transistor of said first conductive type on the opposite side to said first transistor of said second conductive type, there are a twelfth and a thirteenth contacts provided respectively in a diffusion layer area of the source and that of the drain of said second transistor of said second conductive type, there is a fourteenth contact provided on said second gate wire between said second transistor of said second conductive type and said first transistor of said first conductive type, said first contact is connected with said replica bit line, said third and said fifth contacts are connected with said first or said second constant voltage source, said fourth contact is connected with said first constant voltage source, said twelfth contact is connected with said second constant voltage source, said sixth and said fourteenth contacts are connected with each other by a first metal wire, said seventh, said ninth, said tenth and said thirteenth contacts are connected with each other by a second metal wire and further with said first constant voltage source, said eighth contact is connected with said replica bit bar line, and said eleventh contact is connected with a word line.

6. The circuit layout of said dummy cell in the semiconductor memory device of claim 4, wherein within said dummy cell, said first and said second transistors of said first conductive type are arranged side by side vertically such that they share a diffusion layer area, said third and said fourth transistors of said first conductive type are arranged, at positions of point symmetry with respect to said first and said second transistors of said first conductive type, side by side vertically such that they share a diffusion layer area, said first transistor of said second conductive type shares a first straight gate wire with said second transistor of said first conductive type, and is located between said second transistor of said first conductive type and said third transistor of said first conductive type yet closer to said second transistor of said first conductive type, said second transistor of said second conductive type shares a second straight gate wire with said fourth transistor of said first conductive type, and is located at a position of point symmetry with respect to said first transistor of said second conductive type between said first transistor of said first conductive type and said fourth transistor of said first conductive type, there is a first contact provided in a diffusion layer area of the drain of said first transistor of said first conductive type, there is a second contact provided in a diffusion layer area of the source of said second transistor of said first conductive type, there is a third contact provided on a gate wire of said first transistor of said first conductive type on the opposite side to said second transistor of said second conductive type, there are a fourth and a fifth contacts provided respectively in a diffusion layer area of the source and that of the drain of said first transistor of said second conductive type, there is a sixth contact provided on said first gate wire between said first transistor of said second conductive type and said third transistor of said first conductive type, there is a seventh contact provided in a diffusion layer area of the drain of said third transistor of said first conductive type, there is an eighth contact provided in a diffusion layer area of the common source/drain between said third and said fourth transistors of said first conductive type, there is a ninth contact provided in a diffusion layer area of the source of said fourth transistor of said first conductive type, there is a tenth contact provided on a gate wire of said second transistor of said first conductive type on the opposite side to said first transistor of said second conductive type, there are an eleventh and a twelfth contacts provided respectively in a diffusion layer area of the source and that of the drain of said second transistor of said second conductive type, there is a thirteenth contact provided on said second gate wire between said second transistor of said second conductive type and said first transistor of said first conductive type, said first contact is connected with said replica bit line, said second and said fourth contacts are connected with said first or said second constant voltage source, said third contact is connected with said first constant voltage source, said eleventh contact is connected with said second constant voltage source, said fifth and said thirteenth contacts are connected with each other by a first metal wire, and said first metal wire extends to an upper layer of the diffusion layer area which is shared by said first and said second transistors of said first conductive type, said sixth, said eighth, said ninth and said twelfth contacts are connected with each other by a second metal wire and further with said first constant voltage source, said seventh contact is connected with said replica bit bar line, and said tenth contact is connected with said word line.

7. The semiconductor memory device of claim 1, wherein said dummy cell comprises a first, a second, a third and a fourth transistors of a first conductive type, a first and a second transistors of a second conductive type, and a first and a second nodes, the drain, the gate and the source of said first transistor of said first conductive type are connected respectively with a replica bit line, a first constant voltage source and the drain of said first transistor of said second conductive type, the drain, the gate and the source of said second transistor of said first conductive type are connected respectively with said first node, said second node and said first constant voltage source, the drain, the gate and the source of said third transistor of said first conductive type are connected respectively with a replica bit bar line, a word line and said second node, the drain, the gate and the source of said fourth transistor of said first conductive type are connected respectively with said second node, said first node and said first constant voltage source, the drain, the gate and the source of said first transistor of said second conductive type are connected respectively with the source of said first transistor of said first conductive type, said second node and said first constant voltage source or a second constant voltage source, the drain, the gate and the source of said second transistor of said second conductive type are connected respectively with said second node, said first node and said second constant voltage source, and said second node is connected with said second constant voltage source.

8. The semiconductor memory device of claim 1, wherein said dummy cell comprises a first, a second, a third and a fourth transistors of a first conductive type, a first transistor of a second conductive type, and a first and a second nodes, the drain, the gate and the source of said first transistor of said first conductive type are connected respectively with a replica bit line, a first constant voltage source and the drain of said second transistor of said first conductive type, the drain, the gate and the source of said second transistor of said first conductive type are connected respectively with the source of said first transistor of said first conductive type, said second node and said first or a second constant voltage source, the drain, the gate and the source of said third transistor of said first conductive type are connected respectively with a replica bit bar line, a word line and said second node, the drain, the gate and the source of said fourth transistor of said first conductive type are connected respectively with said second node, said first node and said first constant voltage source, the drain, the gate and the source of said first transistor of said second conductive type are connected respectively with said second node, said first node and said second constant voltage source, and said second node is connected with said first constant voltage source.

9. The semiconductor memory device of claim 1, wherein said dummy cell comprises a first, a second and a third transistors of a first conductive type, a first and a second transistors of a second conductive type, and a first and a second nodes, the drain, the gate and the source of said first transistor of said first conductive type are connected respectively with a replica bit line, a first constant voltage source and the drain of said first transistor of said second conductive type, the drain, the gate and the source of said second transistor of said first conductive type are connected respectively with a replica bit bar line, a word line and said second node, the drain, the gate and the source of said third transistor of said first conductive type are connected respectively with said second node, said first node and said first constant voltage source, the drain, the gate and the source of said first transistor of said second conductive type are connected respectively with the source of said first transistor of said first conductive type, said second node and said first constant voltage source or a second constant voltage source, the drain, the gate and the source of said second transistor of said second conductive type are connected respectively with said second node, said first node and said second constant voltage source, and said second node is connected with said second constant voltage source.

10. The semiconductor memory device of claim 4, wherein said replica bit bar line is severed between the connection with said replica cell and the connection with said dummy cell.

11. The semiconductor memory device of claim 7, wherein said replica bit bar line is severed between the connection with said replica cell and the connection with said dummy cell.

12. The semiconductor memory device of claim 8, wherein said replica bit bar line is severed between the connection with said replica cell and the connection with said dummy cell.

13. The semiconductor memory device of claim 9, wherein said replica bit bar line is severed between the connection with said replica cell and the connection with said dummy cell.

14. The semiconductor memory device of claim 4, wherein said metal wire, said contact or said diffusion layer area which connects said replica bit bar line with said third transistor of said first conductive type of said dummy cell is removed.

15. The semiconductor memory device of claim 7, wherein said metal wire, said contact or said diffusion layer area which connects said replica bit bar line with said third transistor of said first conductive type of said dummy cell is removed.

16. The semiconductor memory device of claim 8, wherein said metal wire, said contact or said diffusion layer area which connects said replica bit bar line with said third transistor of said first conductive type of said dummy cell is removed.

17. The semiconductor memory device of claim 9, wherein said metal wire, said contact or said diffusion layer area which connects said replica bit bar line with said second transistor of said first conductive type of said dummy cell is removed.

18. The semiconductor memory device of claim 1, comprising plural such dummy cells.

19. The semiconductor memory device of claim 1, wherein said replica cells comprise a transistor which is connected with said replica bit line, and between said replica cells and said dummy cell, there is a cell which has the same structure as those of said replica cells and in which said transistor is off.

20. The semiconductor memory device of claim 1, wherein the number of such dummy cells is changed depending upon the memory capacity of said memory array.

* * * * *